(12) United States Patent
Chen et al.

(10) Patent No.: US 9,746,734 B2
(45) Date of Patent: Aug. 29, 2017

(54) PIXEL STRUCTURE AND MANUFACTURING METHOD THEREOF, DISPLAY PANEL AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Lei Chen, Beijing (CN); Zhilong Peng, Beijing (CN); Wukun Dai, Beijing (CN); Huanping Liu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 5 days.

(21) Appl. No.: 14/802,601

(22) Filed: Jul. 17, 2015

(65) Prior Publication Data

US 2016/0085124 A1    Mar. 24, 2016

(30) Foreign Application Priority Data

Sep. 19, 2014    (CN) .......................... 2014 1 0484549

(51) Int. Cl.
*H01L 27/12*      (2006.01)
*G02F 1/1362*    (2006.01)

(52) U.S. Cl.
CPC ...... *G02F 1/136286* (2013.01); *H01L 27/124* (2013.01); *H01L 27/1259* (2013.01);
(Continued)

(58) Field of Classification Search
CPC ............... H01L 27/124; H01L 27/1259; G02F 1/136286
See application file for complete search history.

(56) References Cited

U.S. PATENT DOCUMENTS

| 2008/0061296 A1 | 3/2008 | Kim et al. |
| 2012/0061665 A1* | 3/2012 | Miyake ............... H01L 27/1225 257/43 |
| 2014/0139770 A1* | 5/2014 | Ahn .................. G02F 1/133345 349/43 |

FOREIGN PATENT DOCUMENTS

| CN | 1837936 A | 9/2006 |
| CN | 101359670 A | 2/2009 |

(Continued)

OTHER PUBLICATIONS

Office Action dated Jul. 25, 2016 issued in corresponding Chinese Application No. 201410484549.2.

*Primary Examiner* — Phat X Cao
(74) *Attorney, Agent, or Firm* — Nath, Goldberg & Meyer; Joshua B. Goldberg; Annie J. Kock

(57) ABSTRACT

The present invention relates to a pixel structure and a manufacturing method thereof, a display panel and a display device. The pixel structure comprises a plurality of columns of pixels, a data line is provided between every two adjacent columns of pixels, each pixel comprises a pixel electrode and a thin film transistor comprising a gate, an active layer, a source and a drain, wherein, a gate protective layer is provided between the gates and the active layers, grooves, each of which is at least partially located between two adjacent columns of pixels, are provided in the gate protective layer, for opposite ends of the pixel electrodes of the two adjacent columns of pixels and the data line between the two adjacent columns of pixels, one is located in the groove, and the other is located on a part of the gate protective layer without the groove.

9 Claims, 4 Drawing Sheets

(52) U.S. Cl.
CPC ............ *G02F 2001/136218* (2013.01); *G02F 2001/136295* (2013.01)

(56) References Cited

FOREIGN PATENT DOCUMENTS

| CN | 103969865 A | 8/2014 |
|----|-------------|--------|
| TW | 201220507 A | 5/2012 |

\* cited by examiner

PIXEL STRUCTURE AND MANUFACTURING METHOD THEREOF, DISPLAY PANEL AND DISPLAY DEVICE

FIELD OF THE INVENTION

The present invention relates to the field of liquid crystal display technology, and particularly relates to a pixel structure and a manufacturing method thereof, a display panel comprising the pixel structure and a display device comprising the display panel.

BACKGROUND OF THE INVENTION

With the continuous development of display technology, resolution of a display device becomes higher and higher, and accordingly, pixel density in unit area increases under the condition of unchanged size of the display device. However, with the increase in pixel density, distance between adjacent pixels and distance among respective units in each pixel becomes smaller and smaller.

FIG. 1 is a schematic partial diagram of a pixel structure of an existing display device, FIG. 2 is a cross-sectional view of the pixel structure shown in FIG. 1 taken along line A-A'. As shown in FIGS. 1 and 2, each pixel in the pixel structure comprises a pixel electrode 1 and a TFT (Thin Film Transistor) comprising a gate, an active layer, a source and a drain, and a gate protective layer is provided between the gates and the active layers. Specifically, in general, the gate protective layer is not only provided in the area of each pixel, but is also provided in the area between adjacent pixels. The pixel structure further comprises a plurality of data lines 2 and a plurality of gate lines 3, each data line 2 is connected to the pixels in the same column (generally, except one data line 2 connected to the pixels in the leftmost column or in the rightmost column, all other data lines 2 are each arranged between two adjacent columns of pixel units), each gate line 3 is connected to the pixels in the same row (generally, except one gate line 3 connected to the pixels in the upmost row or in the lowermost row, all other gate lines 3 are each arranged between two adjacent rows of pixel units), and the data lines 2 and the pixel electrodes 1 are provided in the same plane.

When the distance between adjacent pixels and the distance among the respective units in each pixel become smaller and smaller, it can be understood that, distance between the pixel electrode 1 and the data line 2 becomes smaller. In this case, capacitance-coupling effect is likely to occur between the pixel electrode 1 and the data line 2 due to the decreased distance between the pixel electrode 1 and the data line 2, and disturbs signals transmitted in the data line 2 and other signal lines. In addition, the decreased distance between the pixel electrode 1 and the data line 2 may also result in increased influence of process fluctuation in the process of manufacturing the pixel structure on shapes of the respective units in the pixel, therefore, performance of the pixel is affected, and display effect of the display device is affected.

SUMMARY OF THE INVENTION

The present invention provides a pixel structure and a manufacturing method thereof, a display panel and a display device, in order to solve at least one of the technical problems existing in the prior art. In the pixel structure, the total distance between the data line and the pixel electrode is relatively large, therefore, the capacitance-coupling effect between the pixel electrode and the data line is relatively small, and process fluctuation in the process of manufacturing the pixel structure has a relatively small influence on the performance and uniformity of the pixels.

According to one aspect of the present invention, there is provided a pixel structure, which comprises a plurality of columns of pixels, a data line is provided between every two adjacent columns of pixels, each pixel comprises a pixel electrode and a thin film transistor comprising a gate, an active layer, a source and a drain, wherein, a gate protective layer is provided between the gates and the active layers, grooves, each of which is at least partially located between two adjacent columns of pixels, are provided in the gate protective layer, for opposite ends of the pixel electrodes of the two adjacent columns of pixels and the data line between the two adjacent columns of pixels, one is located in the groove, and the other is located on a part of the gate protective layer without the groove.

In an example, each groove is provided in an area corresponding to the data line, and the data line is provided in the groove.

In an example, the data line is provided at the bottom of the groove.

In an example, the maximum depth of the groove is smaller than the thickness of the gate protective layer.

In an example, the grooves are located at both sides of the data lines, respectively, and the opposite ends of the pixel electrodes of the two adjacent columns of pixels are located in the grooves, respectively.

In an example, the opposite ends of the pixel electrodes of the two adjacent columns of pixels are located at the bottoms of the grooves, respectively.

In an example, the depth of the grooves is equal to the thickness of the gate protective layer.

According to another aspect of the present invention, there is provided a manufacturing method of a pixel structure, which comprises steps of:

preparing gates;

preparing a gate protective layer; and preparing, grooves, each of which is at least partially located between two adjacent columns of pixels of the pixel structure, in the gate protective layer.

In an example, each groove is provided in an area for preparing a data line, and accordingly, the manufacturing method of a pixel structure further comprises a step of: preparing data lines in the grooves.

In an example, the grooves are provided at both sides of an area for preparing a data line, respectively, and accordingly, the manufacturing method of a pixel structure further comprises a step of:

preparing pixel electrodes on the gate protective layer such that opposite ends of the pixel electrodes of the two adjacent columns of pixels are located in the grooves, respectively.

According to still another aspect of the present invention, there is provided a display panel, which comprises the above pixel structure provided by the present invention.

According to yet another aspect of the present invention, there is provided a display device, which comprises the above display panel provided by the present invention.

The present invention can achieve the beneficial effects as follows.

In the pixel structure provided by the present invention, grooves are provided in the gate protective layer, for opposite ends of the pixel electrodes of the two adjacent columns of pixels and the data line located between the two adjacent columns of pixels, one is provided in the groove and the other is provided on the part of the gate protective layer without the groove, so that the ends of the pixel electrodes and the data line are not in the same plane perpendicular to a depth direction of the groove. As such, the total distance between the pixel electrode and the data line is increased under the condition that the distance, in a direction perpendicular to the depth direction of the groove, between the data line and the end of the pixel electrode maintains unchanged, thus, the capacitance-coupling effect between the pixel electrode and the data line can be reduced, and disturbance to signal transmission in the data line and the other signal lines can be reduced. In addition, by increasing the total distance between the pixel electrode and the data line, influence of process fluctuation on shapes of the respective units in the pixel can be reduced in the process of manufacturing the pixel structure, therefore, performance and uniformity of the pixels can be ensured, and display effect of the display device can be ensured.

In the manufacturing method of a pixel structure provided by the present invention, grooves are provided in the gate protective layer, for opposite ends of the pixel electrodes of the two adjacent columns of pixels and the data line located between the two adjacent columns of pixels, one is provided in the groove and the other is provided on the part of the gate protective layer without the groove, so that the ends of the pixel electrodes and the data line are not in the same plane perpendicular to a depth direction of the groove. As such, the total distance between the pixel electrode and the data line is increased under the condition that the distance, in a direction perpendicular to the depth direction of the groove, between the data line and the end of the pixel electrode maintains unchanged, thus, the capacitance-coupling effect between the pixel electrode and the data line can be reduced, and disturbance to signal transmission in the data line and the other signal lines can be reduced. In addition, by increasing the total distance between the pixel electrode and the data line, influence of process fluctuation on shapes of the respective units in the pixel can be reduced in the process of manufacturing the pixel structure, therefore, performance and uniformity of the pixels can be ensured, and display effect of the display device can be ensured.

As the display panel provided by the present invention comprises the above pixel structure provided by the present invention, the capacitance-coupling effect between the pixel electrode and the data line can be reduced, and thus disturbance to signal transmission in the data line and the other signal lines can be reduced. In addition, influence of process fluctuation in the process of manufacturing the pixel structure on shapes of the respective units in the pixel can also be reduced, thus, performance and uniformity of the pixels can be ensured, and display effect of the display panel can be ensured.

As the display device provided by the present invention comprises the above display panel provided by the present invention, the capacitance-coupling effect between the pixel electrode and the data line can be reduced, and thus disturbance to signal transmission in the data line and the other signal lines can be reduced. In addition, influence of process fluctuation in the process of manufacturing the pixel structure on shapes of the respective units in the pixel can also be reduced, thus, performance and uniformity of the pixels can be ensured, and display effect of the display panel can be ensured.

BRIEF DESCRIPTION OF THE DRAWINGS

Accompanying drawing, which constitute a part of the description, are used for providing further understanding of the present invention, and for explaining the present invention together with the following specific implementations, rather than limiting the present invention. In the accompanying drawings.

DETAILED DESCRIPTION OF THE EMBODIMENTS

The specific implementations of the present invention are described in detail below in conjunction with the accompanying drawings. It should be understood that, the specific implementations described herein are merely used for describing and explaining the present invention, rather than limiting the present invention.

Figure 1:
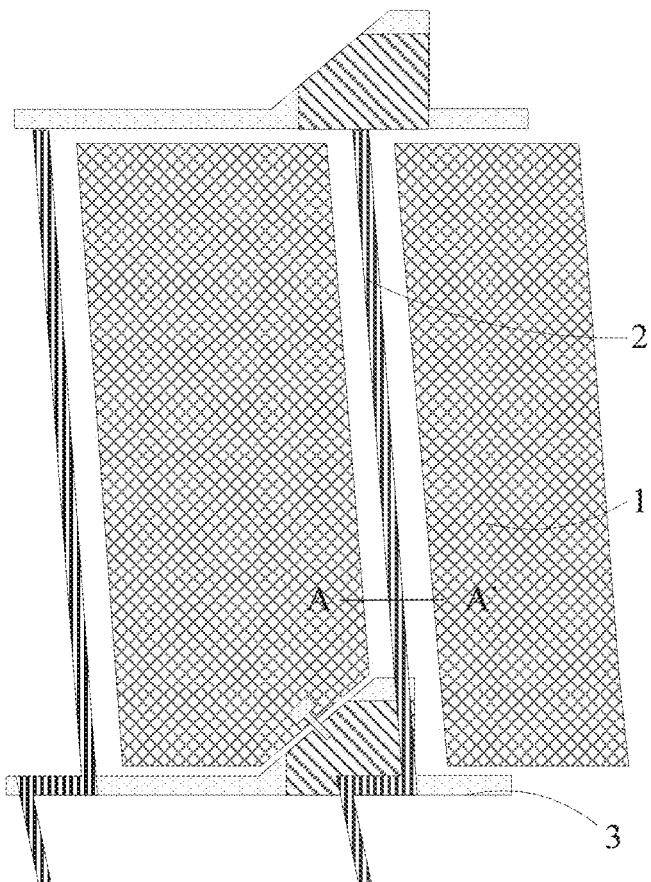
FIG. 1 is a schematic partial diagram of a pixel structure of an existing display device.
Figure 2:
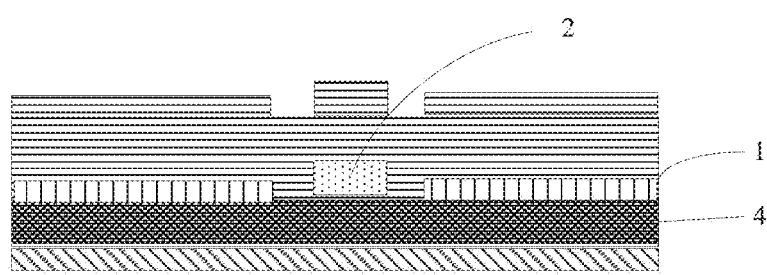
FIG. 2 is a cross-sectional view of the pixel structure shown in FIG. 1 taken along line A-A'.
Figure 3:
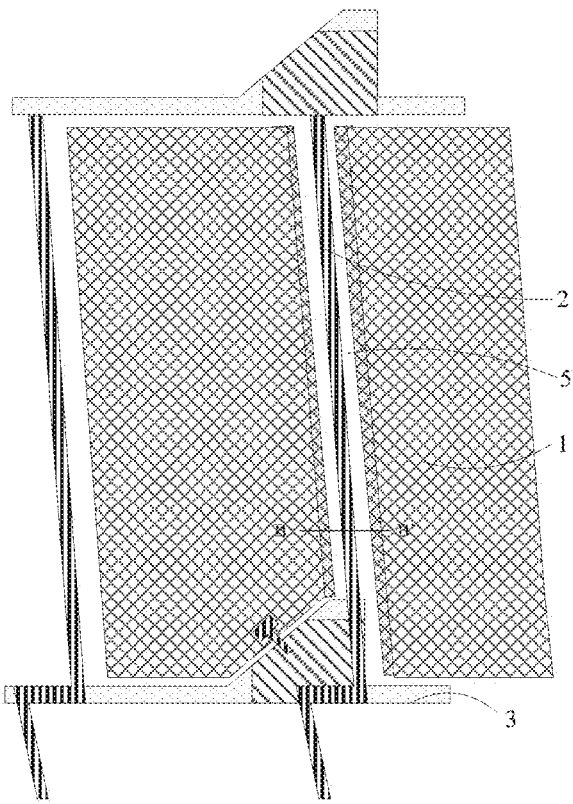
FIG. 3 is schematic diagram of a first implementation of a pixel structure provided by an embodiment of the present invention.
Figure 4:
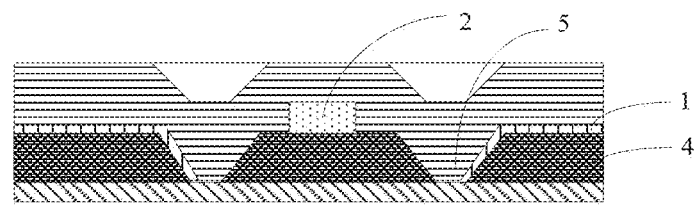
FIG. 4 is a cross-sectional view of the pixel structure shown in FIG. 3 taken along line B-B'.

Referring to FIGS. 3 and 4, FIG. 3 is schematic diagram of a first implementation of a pixel structure provided by an embodiment of the present invention, and FIG. 4 is a cross-sectional view of the pixel structure shown in FIG. 3 taken along line B-B'. In this implementation, the pixel structure comprises a plurality of columns of pixels, a data line 2 is provided between every two adjacent columns of pixels, and each pixel comprises a pixel electrode 1 and a thin film transistor comprising a gate, an active layer, a source and a drain. A gate protective layer 4 is provided between the gates and the active layers, grooves 5, each of which is at least partially located between two adjacent columns of pixels, are provided in the gate protective layer 4. Specifically, in every two adjacent columns of pixels, the grooves 5 may be located at both sides of the data line 2, respectively, the opposite ends (i.e., ends close to the data line 2) of the pixel electrodes 1 of the two adjacent columns of pixels are located in the grooves 5, respectively, and the data line 2 is located on a part of the gate protective layer 4 without the groove 5.

Specifically, a portion other than both ends of the pixel electrode 1 and the data line 2 are located in the same plane perpendicular to the depth direction of the groove 5. In this implementation, by providing one part of the groove 5 between the two adjacent columns of pixels, and providing the other part thereof in an area corresponding to the ends of the pixel electrodes 1, the end of each pixel electrode 1 close to the data line 2 is located in the groove 5. In this way, the ends of the pixel electrodes 1 and the data line 2 are not in the same plane perpendicular to a depth direction of the groove 5, and the total distance between the end of each pixel electrode 1 and the data line 2 is thus increased, under the condition that the distance (i.e., the distance between the end of the pixel electrode 1 and the data line 2 in the prior art), in a direction perpendicular to the depth direction of the groove 5, between the data line 2 and the end of the pixel electrode 1 maintains unchanged. Compared to the prior art, in this implementation, the total distance between the end of the pixel electrode 1 and the data line 2 is increased, the capacitance-coupling effect between the pixel electrode 1 and the data line 2 can be reduced due to the increased total distance therebetween, and disturbance to signal transmission in the data line 2 and other signal lines can be reduced. In addition, as the total distance between the end of the pixel electrode 1 and the data line 2 is increased, influence of process fluctuation on shapes of the respective units in the pixel can be reduced in the process of manufacturing the pixel structure, therefore, performance and uniformity of the pixels can be ensured, and display effect of the display device can be ensured.

In this implementation, preferably, end of the pixel electrode 1 close to the data line 2 is provided at the bottom of the groove 5, and in this way, the distance, in the depth direction of the groove 5, between the end of the pixel electrode 1 and the data line 2 may be as large as possible. Therefore, the total distance between the end of the pixel electrode 1 and the data line 2 can be increased to the largest extent, under the condition that the distance, in the direction perpendicular to the depth direction of the groove 5, between the pixel electrode 1 and the data line 2 maintains unchanged, so that the capacitance-coupling effect between the pixel electrode 1 and the data line 2 is minimum.

Further, the depth of the groove 5 may be equal to the thickness of the gate protective layer 4. In this case, the depth of the groove 5 reaches a maximum, the total distance between the end of the pixel electrode 1 and the data line 2 can be increased by increasing the depth of the groove 5, and thus the capacitance-coupling effect between the pixel electrode 1 and the data line 2 is further reduced.

Figure 5:
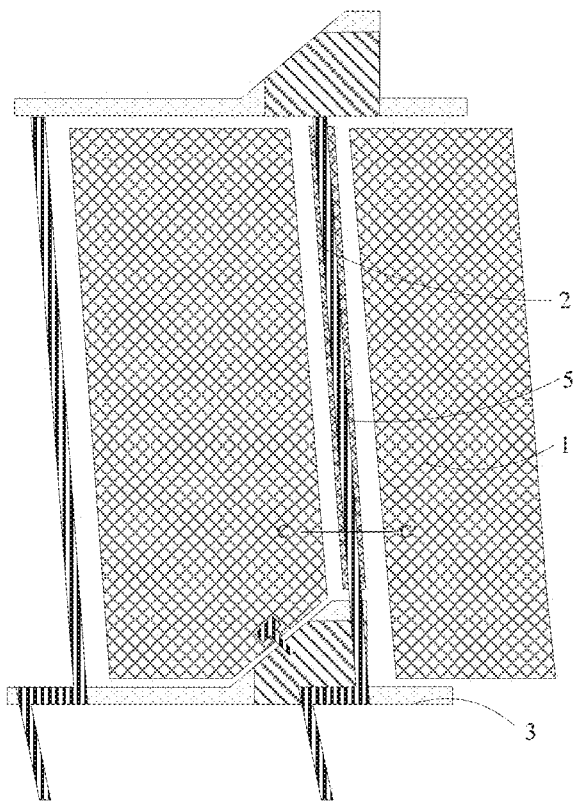
FIG. 5 is schematic diagram of a second implementation of a pixel structure provided by an embodiment of the present invention.
Figure 6:
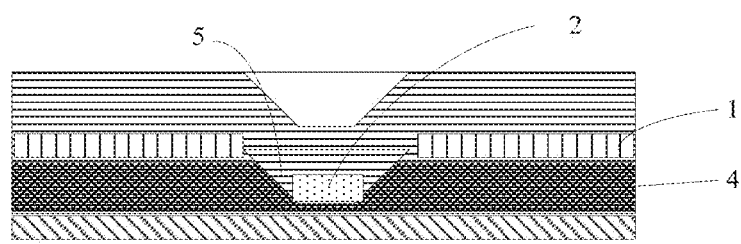
FIG. 6 is a cross-sectional view of the pixel structure shown in FIG. 5 taken along line C-C'.

Referring to FIGS. 5 and 6, FIG. 5 is schematic diagram of a second implementation of a pixel structure provided by an embodiment of the present invention, and FIG. 6 is a cross-sectional view of the pixel structure shown in FIG. 5 taken along line C-C'. Compared to the first implementation described above, the pixel structure in this implementation also comprises a plurality of columns of pixels, a data line 2 is provided between every two adjacent columns of pixels, and each pixel comprises a pixel electrode 1 and a thin film transistor comprising a gate, an active layer, a source and a drain. A gate protective layer 4 is provided between the gates and the active layers, and grooves 5 are provided in the gate protective layer 4, which have been described in detail in the first implementation described above and the same structures as those in the first implementation are not repeated in this implementation.

Thereinafter, only the difference between the second implementation and the first implementation of the pixel structure provided by embodiments of the present invention is described in detail. In this implementation, the groove 5 is provided in an area corresponding to the data line 2, the data line 2 is provided in the groove 5, and the pixel electrode 1 is provided on a part of the gate protective layer 4 without the groove 5. Specifically, the groove is provided in an area of the gate protective layer 4 for providing the data line 2, so that the data line 2 can be provided in the groove 5. In this way, the total distance between the end of the pixel electrode 1 and the data line 2 is increased, under the condition that the distance (i.e., the distance between the pixel electrode 1 and the data line 2 in the prior art), in the direction perpendicular to the depth direction of the groove 5, between the end of the pixel electrode 1 and the data line 2 maintains unchanged. Compared to the prior art, in this implementation, the total distance between the end of the pixel electrode 1 and the data line 2 is increased, thus the capacitance-coupling effect between the pixel electrode 1 and the data line 2 can be reduced, and disturbance to signal transmission in the data line 2 and other signal lines can be reduced. In addition, as the total distance between the pixel electrode 1 and the data line 2 is increased, influence of process fluctuation on shapes of the respective units in the pixel can be reduced in the process of manufacturing the pixel structure, therefore, performance and uniformity of the pixels can be ensured, and display effect of the display device can be ensured.

Preferably, in this implementation, the data line 2 is provided at the bottom of the groove 5, in this way, the total distance between the data line 2 and the pixel electrode 1 can be increased to the largest extent, and the capacitance-coupling effect between the data line 2 and the pixel electrode 1 can be reduced to the largest extent.

In this implementation, the maximum depth of the groove 5 is smaller than the thickness of the gate protective layer 4. In this way, the data line 2 provided at the bottom of the groove 5 is prevented from contacting with the gate lines prepared under the gate protective layer 4, thus influence of the contact between the data lines 2 gate lines on signal transmission in the data lines 2 and the gate lines is avoid.

In summary, in the pixel structure provided by the present invention, grooves 5 are provided in the gate protective layer 4, and for opposite ends of the pixel electrodes 1 of the two adjacent columns of pixels and the data line 2 located between the two adjacent columns of pixels, one is provided in the groove 5 and the other is provided in a part of the gate protective layer 4 without the groove 5, so that the ends of the pixel electrodes 1 and the data line 2 are not in the same plane perpendicular to a depth direction of the groove 5. As such, the total distance between the end of the pixel electrode 1 and the data line 2 is increased, under the condition that the distance, in a direction perpendicular to the depth direction of the groove, between the data line and the end of the pixel electrode maintains unchanged, thus, the capacitance-coupling effect between the pixel electrode 1 and the data line 2 can be reduced, and disturbance to signal transmission in the data line 1 and the other signal lines can be reduced. In addition, by increasing the total distance between the pixel electrode 1 and the data line 2, influence of process fluctuation on shapes of the respective units in the pixel can be reduced in the process of manufacturing the pixel structure, therefore, performance and uniformity of the pixels can be ensured, and display effect of the display device can be ensured.

Figure 7:
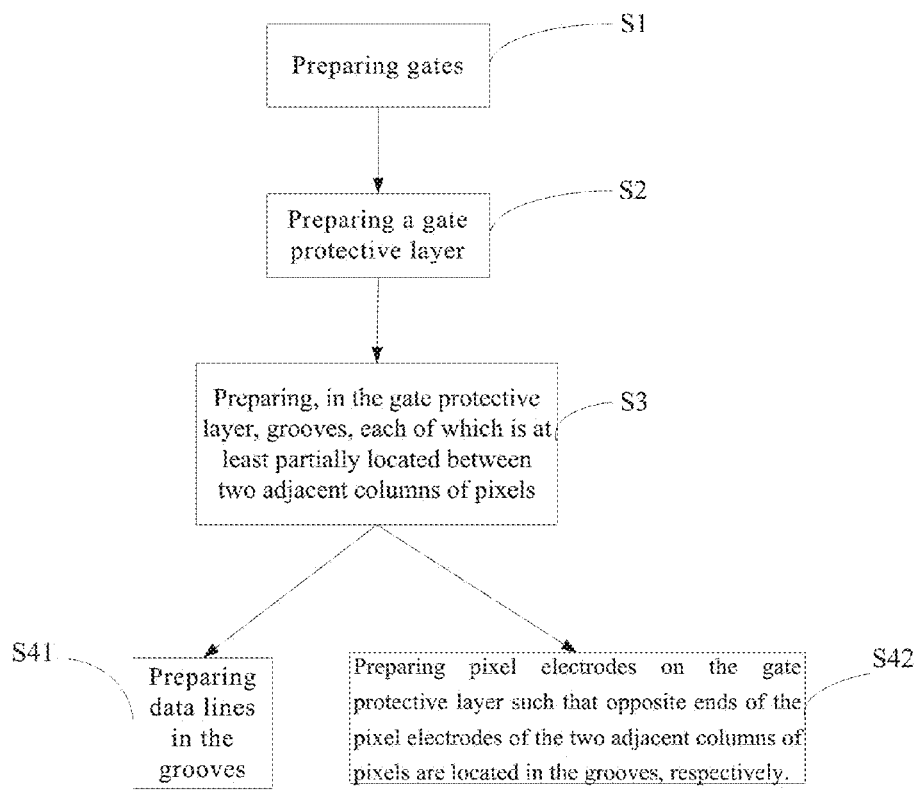
FIG. 7 is a flowchart of a preferable implementation of a manufacturing method of a pixel structure provided by an embodiment of the present invention.

As another aspect of the present invention, there is provided a manufacturing method of a pixel structure. Referring to FIG. 7, FIG. 7 is a flowchart of a preferable implementation of a manufacturing method of a pixel structure provided by an embodiment of the present invention. In this implementation, the manufacturing method of a pixel structure includes steps as follows.

S1: preparing gates. Specifically, in this step, the gates are prepared on a substrate by photolithographic process, i.e., through depositing, coating of photoresist, exposing, etching and other process. The material of the gates is generally aluminum (Al) or copper (Cu).

S2: preparing a gate protective layer. Specifically, in this step, the gate protective layer is prepared on the substrate with the gates provided thereon by photolithographic process similar to that used in preparing the gates. The material of the gate protective layer is generally silicon dioxide or silicon nitride.

S3: preparing grooves, each of which is at least partially located between two adjacent columns of pixels in the gate protective layer. In this step, the grooves are prepared in the gate protective layer through photolithographic process and dry etching process.

Specifically, in step S3, positions of the prepared grooves in the gate protective layer may be the areas for providing data lines, and in this case, after completing step S3 of preparing grooves, the following step S41 is performed: preparing the data lines in the grooves.

Alternatively, in step S3, grooves may be prepared at both sides of an area for providing a data line, respectively, and in this case, after completing step S3 of preparing grooves, the following step S42 is performed: preparing pixel electrodes on the gate protective layer such that opposite ends of the pixel electrodes of the two adjacent columns of pixels are located in the grooves, respectively. Of course, it can be understood that, the manufacturing method further comprises a step of: preparing data lines on areas of the gate protective layer for providing the data lines, and this step may be performed before or after step S42.

In addition, the manufacturing method may include steps of preparing active layers, sources, drains, and the like, the methods used in these steps are similar to those for preparing active layers, sources and drains in the prior art, and thus are not repeated herein.

In the pixel structure manufactured by using the above method, the data lines and the ends of the pixel electrodes are not in the same plane perpendicular to a depth direction of the groove. As such, the total distance between the data line and the end of the pixel electrode is increased under the condition that the distance, in a direction perpendicular to the depth direction of the groove, between the data line and the end of the pixel electrode maintains unchanged, thus, the capacitance-coupling effect between the pixel electrode and the data line can be reduced, and disturbance to signal transmission in the data line and the other signal lines can be reduced. In addition, by increasing the total distance between the pixel electrode and the data line, influence of process fluctuation on shapes of the respective units in the pixel can be reduced in the process of manufacturing the pixel structure, and therefore, performance and uniformity of the pixels can be ensured.

As still another aspect of the present invention, there is provided a display panel, which comprises the above pixel structure provided by the present invention.

The display panel provided by the present invention comprises the above pixel structure provided by the present invention, therefore, the capacitance-coupling effect between the pixel electrode and the data line can be reduced, and the disturbance to signal transmission in the data line and the other signal lines can be reduced. In addition, influence of process fluctuation in the process of manufacturing the pixel structure on shapes of the respective units in the pixel can also be reduced, thus, performance and uniformity of the pixels can be ensured, and display effect of the display panel can be ensured.

As yet another aspect of the present invention, there is provided a display device, which comprises the above display panel provided by the present invention.

The display device provided by the present invention comprises the above display panel provided by the present invention, therefore, the capacitance-coupling effect between the pixel electrode and the data line can be reduced, and the disturbance to signal transmission in the data line and the other signal lines can be reduced. In addition, influence of process fluctuation in the process of manufacturing the pixel structure on shapes of the respective units in the pixel can also be reduced, thus, performance and uniformity of the pixels can be ensured, and display effect of the display panel can be ensured.

It should be understood that the above implementations are only exemplary implementations for illustrating the principle of the present invention; however, the present invention is not limited thereto. Various variations and improvements can be made by a person skill in the art without departing from the spirit and essence of the present invention, and these variations and improvements should also be considered to be within the protection scope of the present invention.

The invention claimed is:

1. A pixel structure, comprising a plurality of columns of pixels, a data line being provided between every two adjacent columns of pixels, each pixel comprising a pixel electrode and a thin film transistor comprising a gate, an active layer, a source and a drain, wherein, a gate protective layer is provided between the gates and the active layers, and grooves, each of which is at least partially located between two adjacent columns of pixels, are provided in the gate protective layer; and for opposite ends of the pixel electrodes of the two adjacent columns of pixels and the data line between the two adjacent columns of pixels, one is located in the groove(s), and the other is located on a part of the gate protective layer without the groove; and wherein, the grooves are located at both sides of the data lines, respectively, and the entire opposite ends of the pixel electrodes of the two adjacent columns of pixels are located in the grooves, respectively.

2. The pixel structure according to claim 1, wherein, the opposite ends of the pixel electrodes of the two adjacent columns of pixels are located at the bottoms of the grooves, respectively.

3. The pixel structure according to claim 1, wherein, the depth of the grooves is equal to the thickness of the gate protective layer.

4. The pixel structure according to claim 2, wherein, the depth of the grooves is equal to the thickness of the gate protective layer.

5. A manufacturing method of a pixel structure, comprising steps of:

preparing gates;

preparing a gate protective layer; and preparing grooves, each of which is at least partially located between two adjacent columns of pixels of the pixel structure, in the gate protective layer;

wherein, the grooves are provided at both sides of an area for preparing a data line, respectively, and the manufacturing method of a pixel structure further comprises a step of:

preparing pixel electrodes on the gate protective layer such that opposite ends of the pixel electrodes of the two adjacent columns of pixels are entirely located in the grooves, respectively.

6. A display device, comprising a display panel, which comprises a pixel structure, wherein, the pixel structure comprises: a plurality of columns of pixels, a data line is provided between every two adjacent columns of pixels, each pixel comprises a pixel electrode and a thin film transistor comprising a gate, an active layer, a source and a drain, wherein, a gate protective layer is provided between the gates and the active layers, and grooves, each of which is at least partially located between two adjacent columns of pixels, are provided in the gate protective layer; and for opposite ends of the pixel electrodes of the two adjacent columns of pixels and the data line between the two adjacent columns of pixels, one is located in the groove(s), and the other is located on a part of the gate protective layer without the groove;

wherein, the grooves are located at both sides of the data lines, respectively, and the entire opposite ends of the pixel electrodes of the two adjacent columns of pixels are located in the grooves, respectively.

7. The display device according to claim 6, wherein, the opposite ends of the pixel electrodes of the two adjacent columns of pixels are located at the bottoms of the grooves, respectively.

8. The display device according to claim 6, wherein, the depth of the grooves is equal to the thickness of the gate protective layer.

9. The display device according to claim 7, wherein, the depth of the grooves is equal to the thickness of the gate protective layer.

* * * * *